(12) United States Patent
Jain

(10) Patent No.: US 7,283,079 B2
(45) Date of Patent: Oct. 16, 2007

(54) DIGITAL TO ANALOG CONVERTER HAVING A SINGLE CYCLIC RESISTOR STRING AND MULTIPLE CURRENT SOURCES

(75) Inventor: Dinesh Jain, Bangalore (IN)

(73) Assignee: Analog Devices, Inc, Norwood, MA (US)

( * ) Notice: Subject to any disclaimer, the term of this patent is extended or adjusted under 35 U.S.C. 154(b) by 0 days.

(21) Appl. No.: 11/324,427

(22) Filed: Jan. 3, 2006

(65) Prior Publication Data

US 2007/0152860 A1 Jul. 5, 2007

(51) Int. Cl.
*H03M 1/78* (2006.01)
(52) U.S. Cl. .................... 341/154; 341/144
(58) Field of Classification Search ......... 341/140–170
See application file for complete search history.

(56) References Cited

U.S. PATENT DOCUMENTS

| | | | |
|---|---|---|---|
| 5,283,580 A * | 2/1994 | Brooks et al. ............. | 341/154 |
| 5,604,501 A | 2/1997 | McPartland | |
| 5,619,203 A | 4/1997 | Gross, Jr. et al. | |
| 6,621,440 B2 * | 9/2003 | Gorman ..................... | 341/154 |
| 6,977,604 B2 * | 12/2005 | Wada et al. ................ | 341/156 |
| 7,088,277 B2 * | 8/2006 | Kobayashi et al. ......... | 341/156 |

\* cited by examiner

*Primary Examiner*—Lam T. Mai
(74) *Attorney, Agent, or Firm*—Global IP Services, PLLC; Prakash Nama

(57) ABSTRACT

A current driven DAC architecture uses a single resistance string arranged to have a cyclic configuration and a plurality of nodes, one of the nodes being connected to a known potential, e.g., ground potential, and at least two current sources connected to selected ones of said nodes through operable switches, and an output connected to a selected one of said nodes. In one modification, $2^{2n-2}$ LSB (least significant bit) voltage levels are generated as outputs from $2^n$ cyclic string resistors and two current sources. In another modification, spurious-free resolution of (2n-2) bits and (2n-1) bit resolution with lower SNDR are achieved by using $2^n$ resistors and two current sources. In one described embodiment, $2^n$ unit impedances in the cyclic string result in 2(n-1) bit resolution. Thus, the single cyclic string of resistances achieves the function of both MSB sub-string and LSB sub-string.

16 Claims, 6 Drawing Sheets

DIGITAL TO ANALOG CONVERTER HAVING A SINGLE CYCLIC RESISTOR STRING AND MULTIPLE CURRENT SOURCES

FIELD OF THE INVENTION

This invention generally relates to a Digital to Analog converter (DAC), and more particularly to a DAC having a single cyclic resistor string.

BACKGROUND OF THE INVENTION

DACs are indispensable in handling signals where a digital word/signal is to be converted into an analog form. DACs are an essential tool in handling communication signals in information technology including television, sound and movies, as well as handling signals in medical and industrial control loops. DACs are available in several forms, and a common and popular configuration uses a resistor string driven by voltage sources. In U.S. Pat. No. 6,621,440 B2, at least two resistor ladders arranged in a cyclic string are used with two banks of switches. An MSB string is used and connected to complete the function as a DAC and is coupled at two nodes to voltage reference points VREF+ and VREF−, through a virtual short. A LSB (least significant bit) string is coupled across an adjacent node on the MSB (most significant bit) string. Two analog output signals are generated from the ends of the connecting resistors. The output analog signals might be produced from further first and second resistance ladders. The main resistance ladders are driven by first and second reference voltages. U.S. Pat. No. 5,619,203 titled Current Source Driver Converter, issued to George F Gross, Jr et al, on Apr. 8, 1997, teaches a DAC having a resistor string coupled to a current source. U.S. Pat. No. 5,604,501 titled "Digital to Analog Converter with reduced number of resistors", issued to McPartland on Feb. 18, 1997, teaches a DAC using two voltage sources and a resistor string having resistor-potential junctions and taps at resistor junctions. U.S. Pat. No. 5,283,580 titled "Current/Resistor Digital to Analog Converter having enhanced integral non-linearity and method of operation," issued to Todd L Brooks on Feb. 1, 1994, teaches a DAC using series connected resistors using current sources which can be switched to either a first or a second node. The resistors in the Brooks patent are connected between a reference voltage terminal and a third node where an analog output signal is developed.

For design of high precision, low power, and area efficient DACs, resistor string DAC architectures are of prime importance. For high resolution segmented string DACs, the static and dynamic performance is limited by the area of the DAC Core, resistor matching the circuit non-linearity, and first and second order effects like the coupling switch resistance and sub-threshold/leakage current. There are other arrangements in prior art, in which multitude of segmentation and coupling schemes are introduced, using either linear resistance strings or resistance strings driven by voltages. There is generally a loss of implementation area in the prior art arrangements.

Therefore, there is a need for DAC architecture which will be at least as area-efficient as (or better than) the segmented string architecture, while improving some of the key performance indices such as linearity and speed of operation. It is also noted that prior art arrangements offer a limited scope of dynamic element matching because of lack of redundancy caused by the use of conventional resistor string arrangements.

SUMMARY OF THE INVENTION

The present invention teaches a low power cyclic string DAC using single cyclic segmented resistor string architecture. The architecture is of prime importance due to its low power consumption, high level of redundancy and achievable betterment in the core area.

One embodiment of the invention resides in a DAC architecture comprising: a single resistance string arranged to have a cyclic configuration and a plurality of nodes, one of the nodes being connected to a known potential; at least two current sources connected to selected ones of said nodes through operable switches; and an output connected to a selected one of said nodes. The known potential may advantageously be the ground potential. In one modification, $2^{2n-2}$ LSB (least significant bit) voltage levels may be generated as outputs from $2^n$ cyclic string resistors and two current sources. In another modification, spurious-free resolution of (2n−2) bit and (2n−1) bit resolution with lower SNDR (signal to noise and distortion ratio) achieved by using $2^n$ resistors and two current sources.

Based on the nodes of the two coupled current sources and the output node, an analog voltage corresponding to the input digital code is generated. In this way, it is possible to generate $2^{2n-2}$ LSB levels from $2^n$ resistors in the impedance string. Thus, as described herein, a single cyclic impedance string behaves as a combination of MSB and LSB strings. For a cyclic resistor string with $2^n$ resistors and 2 current sources, it is possible to generate all voltage levels for input code $[0, 2^{2n-2}]$.

It is also noted that, for the above mentioned topology, there are $2^{3n}$ possible ways of coupling 2 current sources and one output. But, it generates all voltages between $[0, 2^{2n-2}]$. Therefore, there are multiple ways of generating the voltages for a particular input code. This feature of the present architecture introduces a desirable high level of redundancy which is useful for dynamic element matching and switched capacitor applications.

A second embodiment resides in an integrated circuit including a DAC architecture driven by a digital algorithm and comprising: a single resistance string arranged to have a cyclic configuration and a plurality of nodes, one of the nodes being connected to a known potential; at least two current sources connected to selected ones of said nodes through operable switches; and, an output delivering a voltage, said output being connected to a pre-selected node with selective guidance from said digital algorithm.

Another embodiment resides in a method of designing a DAC architecture, comprising: providing a single cyclic resistor string having a cyclic configuration and a plurality of nodes, and connecting the nodes to a known potential, e.g., using a plurality of current sources and connecting the current sources to selected nodes x and y through a first set of operable first and second switches; and, using a digital switching algorithm for driving the DAC and for selecting a node position for an output node z to which an output line is connected for delivering a desired output voltage. Also included herein is an article comprising a storage medium having instructions thereon which when executed by a computing platform, will result in the foregoing method of designing the DAC.

BRIEF DESCRIPTION OF THE DRAWING

A more detailed understanding of the invention may be had from the following description of embodiments, given by way of example and not as a limitation, to understood in conjunction with the accompanying drawings wherein.

DETAILED DESCRIPTION OF THE INVENTION

In the following detailed description of the various embodiments of the invention, reference is made to the accompanying drawings that form a part hereof, and in which are shown by way of illustration, specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is therefore not to be taken in a limiting sense, and the scope of the present invention is defined only by the appended claims and their equivalents.

Figure 1:
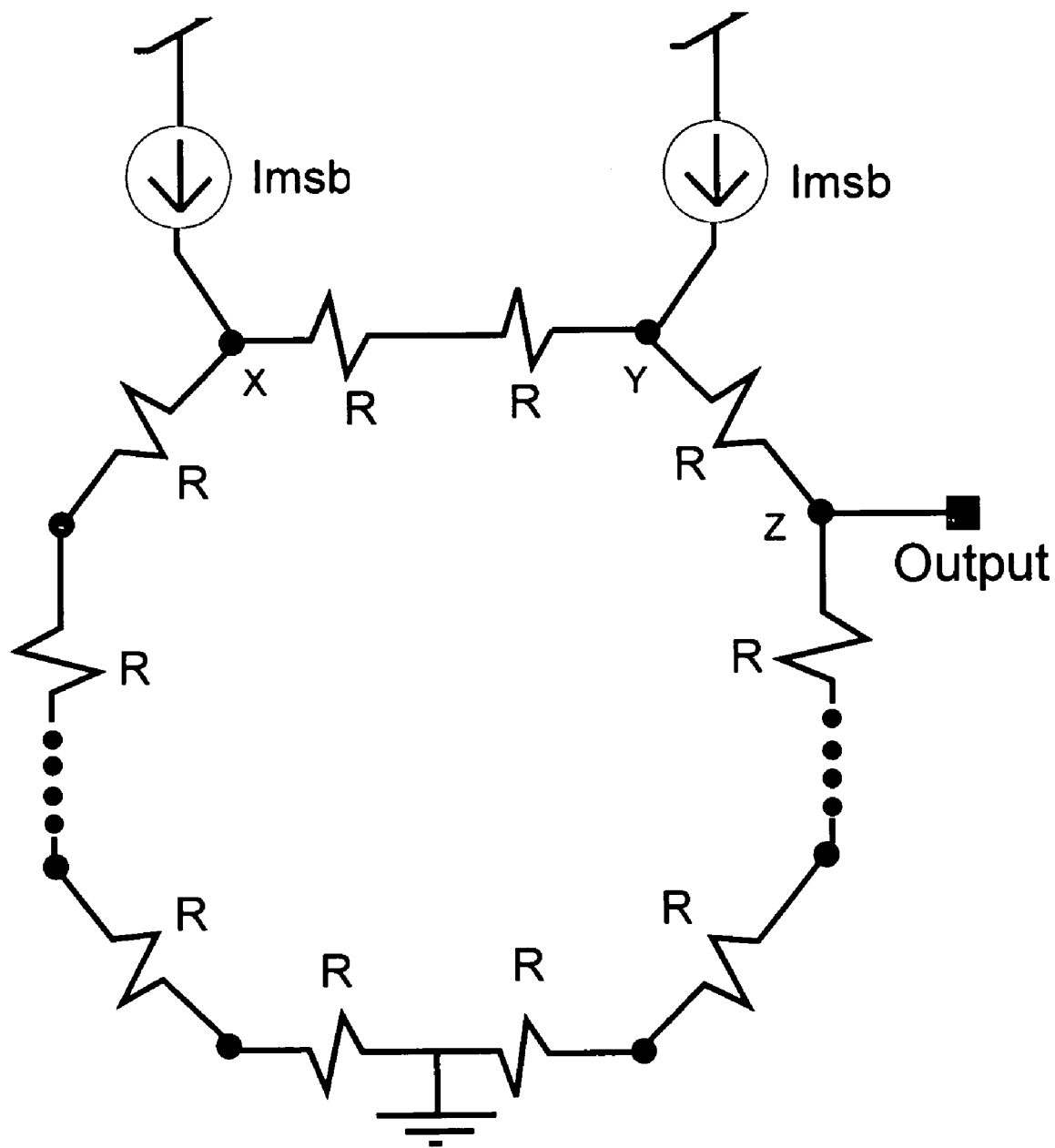
FIG. 1 illustrates a schematic of a cyclic string DAC architecture with 2 current sources $I_{msb}$ and an output connected to node z.

An embodiment of the cyclic resistor string architecture DAC with 2 current sources is shown in FIG. 1. A plurality of $2^n$ resistors is connected end to end and one node of the cyclic string is hard-grounded. Both the current sources have the capability of being connected to any node through MSB Coupling switches. It is noted that the linearity is independent of the switch sizes and switch "ON" resistance, as long as the small signal output impedance of the current sources is higher than the resistor string matching. The MSB Switch size is primarily determined by the available headroom for the current source at FS (Full Scale) code output and the required small signal output impedance.

Figure 2:
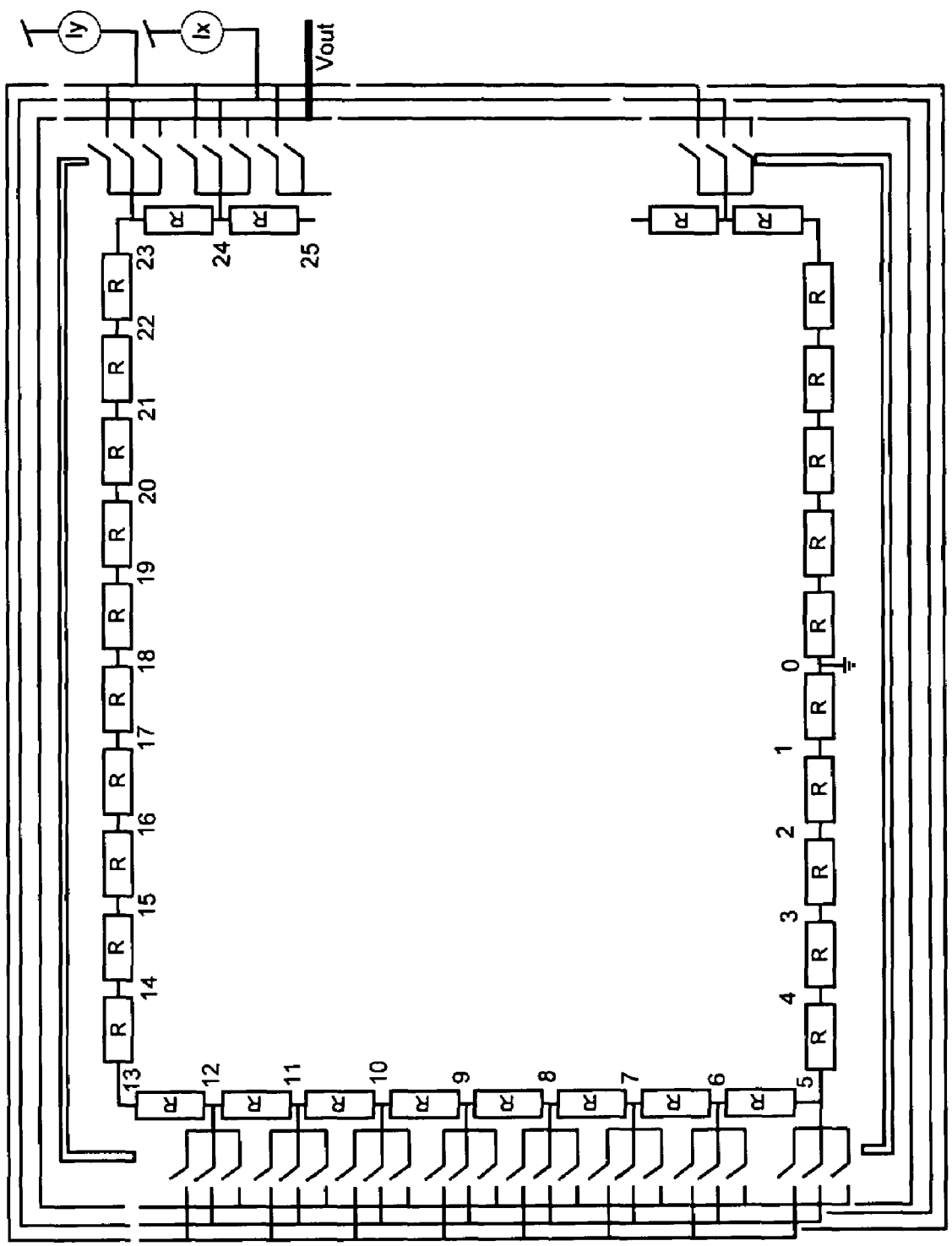
FIG. 2 illustrates an exemplary cyclic string architecture lay out showing resistors R, and current sources Ix, Iy and the output Vout, and one exemplary way of connecting the operable switches.

FIG. 2 illustrates one exemplary cyclic string architecture lay-out showing resistors R, and two current sources Ix, Iy and the output Vout. The configuration illustrated for the resistor arrangement has a rectangular layout as an example. However, any other configuration is acceptable as well, so long as the resistors form a single string connected in a cyclic fashion. More than two current sources are admissible in the illustrated cyclic resistor string. It is noted in the context of FIG. 2 that there is no unique manner of coupling the switches, and the illustration in FIG. 2 is just one exemplary way of connection.

The following are defined:
n=Number of LSB bits.
$V_{lsb}$=Unit LSB Step Size (in volts)
$V_{msb}$=Unit MSB Step Size (in volts)
R=Unit Resistor (in ohms)
$I_{msb}$=Unit MSB Current source (in amps)
$I_{lsb}$=Unit LSB Current (in amps)

Also defined is the relationship among $I_{msb}$, R and $V_{msb}$ as $$I_{msb} = \frac{V_{msb}}{R} = \frac{2^n V_{lsb}}{R}$$

As illustrated in FIG. 1, two current sources are used to justify the feasibility of the illustrated architecture. The grounded node is numbered as 0, and, one of the current sources (shown in the illustration as $I_x$) is connected to node x. The linear resistive distance from node 0 is xR. Similarly, another current source (referred as $I_y$ in the illustration) is connected at node y, the linear resistive distance being (x+y)R from node 0. All the resistive distances are calculated in the clockwise direction from node 0. The output is tapped from a certain node z, at a linear resistive distance of zR from node 0. The nodes x, y and z are controlled by the input digital code (corresponding to the required analog output) and a digital switching algorithm is expediently selected as appropriate, for achieving linearity and area specifications. Details and the choice of a suitable digital switching algorithm are intelligible to those skilled in the art.

The voltage defined by current source $I_x$ alone at the node z is given by $$V_{out-x} = \frac{2^n - x}{2^n} I_{msb} zR = z(2^n - x)V_{lsb}$$

for values of z<=x; and $$V_{out-x} = \frac{x}{2^n} I_{msb}(2^n - z)R = (2^n - z)xV_{lsb}$$

for values of z>x;

Similarly, the voltage defined by current source $I_y$ alone at the node z is given by $$V_{out-y} = \frac{2^n - (x+y)}{2^n} I_{msb} zR = z(2^n - (x+y))V_{lsb}$$

for values of z<=(x+y); and $$V_{out-y} = \frac{x+y}{2^n} I_{msb}(2^n - z)R = (2^n - z)(x+y)V_{lsb}$$

for values of z>(x+y).

It is assumed that the incremental AC impedance of the current sources $I_x$ and $I_y$ is high enough such that the principle of linear superposition is valid. The principle of superposition is used to obtain the output voltage by appropriate use of the above mentioned equations. The choice is based on the boundary conditions (spatial relationship between x, y and z nodes) of the coupling nodes of the current sources and output node. Here, it is seen that the plurality of nodes at which $I_x$ and $I_y$ can be connected and output node is $2^n$ each. This results in the relationship $2^{n+n+n}=2^{3n}$ combination of x, y and z to define the output voltages corresponding to 2n−1 bits only. The maximum possible output voltage is achieved when $x=z=2^{n-1}$ and y=0. Based on the spatial distribution of x, y and z, the following transfer functions are derived.

$$V_{out}=(2x+y)(2^n-z)V_{lsb}$$

for $0 \leq x \leq 2^n, 0 \leq y \leq 2^n, 0 \leq x+y \leq 2^n, x+y \leq z \leq 2^n$ $$V_{out}=[2^n(x+z)-(2x+y)z]V_{lsb}$$

for $0 \leq x \leq 2^n, 0 \leq y \leq 2^n, 0 \leq x+y \leq 2^n, x \leq z \leq x+y$ $$V_{out}=z[2^{n+1}-(2x+y)]V_{lsb}$$

for $0 \leq x \leq 2^n, 0 \leq y \leq 2^n, 0 \leq x+y \leq 2^n, 0 \leq z \leq x$ Using the above equations, it is seen that it is possible to generate all possible codes in the range $[0, 2^{2n-2})$. The above DAC Architecture for n=4 (6b DAC) is demonstrated, by which it is possible to achieve all output codes in the range [0, 63]. One solution set for positions of current sources $I_x$, $I_y$ and the output node is presented in Table 1. It is noted that to couple the current sources and output node to node numbers mentioned in Table 1, corresponding switches should be closed.

TABLE 1

Position of Current sources and output code for 6b DAC.

| Position of $I_x$ with respect to node 0 (clockwise) | Position of $I_y$ with respect to node 0 (clockwise) | Position of Output node with respect to node 0 (clockwise) | Output Code (In #LSB) |
|---|---|---|---|
| 16 | 15 | 0 | 0 |
| 16 | 15 | 1 | 1 |
| 16 | 14 | 1 | 2 |
| 16 | 13 | 1 | 3 |
| 16 | 12 | 1 | 4 |
| 16 | 11 | 1 | 5 |
| 16 | 10 | 1 | 6 |
| 16 | 9 | 1 | 7 |
| 16 | 8 | 1 | 8 |
| 16 | 7 | 1 | 9 |
| 16 | 6 | 1 | 10 |
| 16 | 5 | 1 | 11 |
| 16 | 4 | 1 | 12 |
| 16 | 3 | 1 | 13 |
| 16 | 2 | 1 | 14 |
| 16 | 1 | 1 | 15 |
| 15 | 1 | 1 | 16 |
| 14 | 1 | 1 | 17 |
| 13 | 1 | 1 | 18 |
| 12 | 1 | 1 | 19 |
| 11 | 1 | 1 | 20 |
| 10 | 1 | 1 | 21 |
| 9 | 1 | 1 | 22 |
| 8 | 1 | 1 | 23 |
| 7 | 1 | 1 | 24 |
| 6 | 1 | 1 | 25 |
| 5 | 1 | 1 | 26 |
| 4 | 1 | 1 | 27 |
| 3 | 1 | 1 | 28 |
| 2 | 1 | 1 | 29 |
| 1 | 1 | 1 | 30 |
| 10 | 1 | 3 | 31 |
| 11 | 1 | 4 | 32 |
| 16 | 5 | 3 | 33 |
| 13 | 2 | 2 | 34 |

TABLE 1-continued

Position of Current sources and output code for 6b DAC.

| Position of $I_x$ with respect to node 0 (clockwise) | Position of $I_y$ with respect to node 0 (clockwise) | Position of Output node with respect to node 0 (clockwise) | Output Code (In #LSB) |
|---|---|---|---|
| 13 | 2 | 3 | 35 |
| 12 | 2 | 2 | 36 |
| 13 | 2 | 5 | 37 |
| 13 | 2 | 6 | 38 |
| 13 | 2 | 7 | 39 |
| 12 | 1 | 8 | 40 |
| 13 | 2 | 9 | 41 |
| 13 | 2 | 10 | 42 |
| 12 | 1 | 9 | 43 |
| 11 | 1 | 7 | 44 |
| 14 | 3 | 3 | 45 |
| 15 | 4 | 6 | 46 |
| 11 | 2 | 5 | 47 |
| 10 | 2 | 4 | 48 |
| 15 | 4 | 5 | 49 |
| 16 | 5 | 6 | 50 |
| 15 | 6 | 9 | 51 |
| 15 | 7 | 10 | 52 |
| 14 | 5 | 9 | 53 |
| 13 | 4 | 10 | 54 |
| 13 | 4 | 9 | 55 |
| 12 | 3 | 8 | 56 |
| 13 | 4 | 7 | 57 |
| 13 | 4 | 6 | 58 |
| 13 | 4 | 5 | 59 |
| 13 | 4 | 4 | 60 |
| 15 | 6 | 7 | 61 |
| 14 | 5 | 6 | 62 |
| 16 | 7 | 7 | 63 |

From Table 1, it is seen that all codes for 6b DAC can be generated from the cyclic DAC. Furthermore, it can be seen that all switches, as shown in FIG. 1, are not required, thereby saving some more area.

As noted previously, there are $2^{3n}$ nodal points for various combinations of x, y and z maximum output code achievable is $2^{2n-n}$. On an average, there are $2^{n+1}$ nodal points for each output code. This shows the level of redundancy which exists in this architecture. It is noted that no extra components are added to achieve this level of redundancy. It is also noted that redundancy increases exponentially with n. Therefore, the presently described architecture is ideally suited for higher resolution DACs. In FIG. 2, the frequency of appearance of each output code across all values of x, y and z vs. the output code for a 14b DAC is plotted. The frequency of appearance is defined as the count of appearance of each output code for various combinations of x, y and z. The minimum value of frequency of appearance=4, the maximum being 65790 and the mean value being 793.4. From this, it can be concluded that there are, on an average, 793 combinations of x, y and z to produce the same output code across the entire cyclic string. From the above data, it can be seen that there are several ways to select the positions of x, y and z to achieve the required specification across the entire dynamic range of operation. This provides for existence of a multi-dimensional optimization in the digital algorithm for the best performances in linearity, speed, area and digital core. Furthermore, it is possible to define various cost functions, which when minimized, would give the best ordinate in the performance matrix.

Functioning of the Illustrated Embodiment of the DAC:

An equation defined earlier is considered again here.

$$I_{msb} = \frac{V_{msb}}{R} = \frac{2^n V_{lsb}}{R}$$

A second relationship is expressed by the equation $$I_{lsb} = \frac{I_{msb}}{2^n}$$

From the above equations, it can be generalized that if $I_{msb}$ flows through a unit resistor R, it produces a potential difference of $V_{msb}$ across the unit resistor. Similarly, if $I_{lsb}$ flows through a unit resistor R, it produces a potential difference of $V_{lsb}$ across it.

Using the cyclic string of $2^n$ unit resistors, wherein one node is hard-grounded, one current source of magnitude $I_{msb}$ is connected at that node. As the current source is connected directly to GND, voltage at all nodes on the resistor string will be zero. Now, that current source is moved by one node. The result is a current source connected to a parallel combination of resistors, whose values are R and $(2^n-1)$R. The current division would yield the following:

Current through the path containing $(2^n-1)R=I_{lsb}$ and, current through the path containing $R=I_{msb}-I_{lsb}$, thereby the total current drawn being $I_{msb}$. Now, voltage at any node on the $(2^n-1)$R string will be an integral multiple of $V_{lsb}$, where $V_{lsb}$ is the smallest possible voltage. Similarly, if the current source is moved by another node, it results in a network in which $I_{msb}$ is connected to two resistor paths, with values 2R and $(2^n-2)$R. The current division would yield the following:

Current through the path containing $(2^n-2)R=2 I_{msb}$ and, current through the path containing $2R=I_{msb}-2I_{lsb}$, thereby the total current drawn being $I_{msb}$.

Now, the voltages across the nodes on the path containing $(2^n-2)$R will be a multiple of $2V_{lsb}$. Also, the nodes on the path containing 2R resistors will be a multiple of $V_{msb}-2V_{lsb}$. Continuing this for all nodes would yield some combinations of MSB and LSB voltages.

From the above discussion, it can also be visualized that the cyclic resistor string behaves like a segmented resistor string, with varying number of unit resistors in the primary and secondary strings. This kind of architecture is not possible in case of normal string arrangements, because of the presence of the coupling switches between the primary and the secondary string. Also, unlike the string architecture, both the primary and the secondary strings in the described embodiment are connected across the same node.

Using 2 current sources, it is seen that it is possible to partition any natural number in the closed interval $[0, 2^{2n-2}-1]$, such that by selecting the nodes to couple the current source and the output node, it is possible to achieve the function of a DAC. Also, it is seen that multiple current sources can be used to increase the resolution/dynamic range of the DAC.

Figure 3:
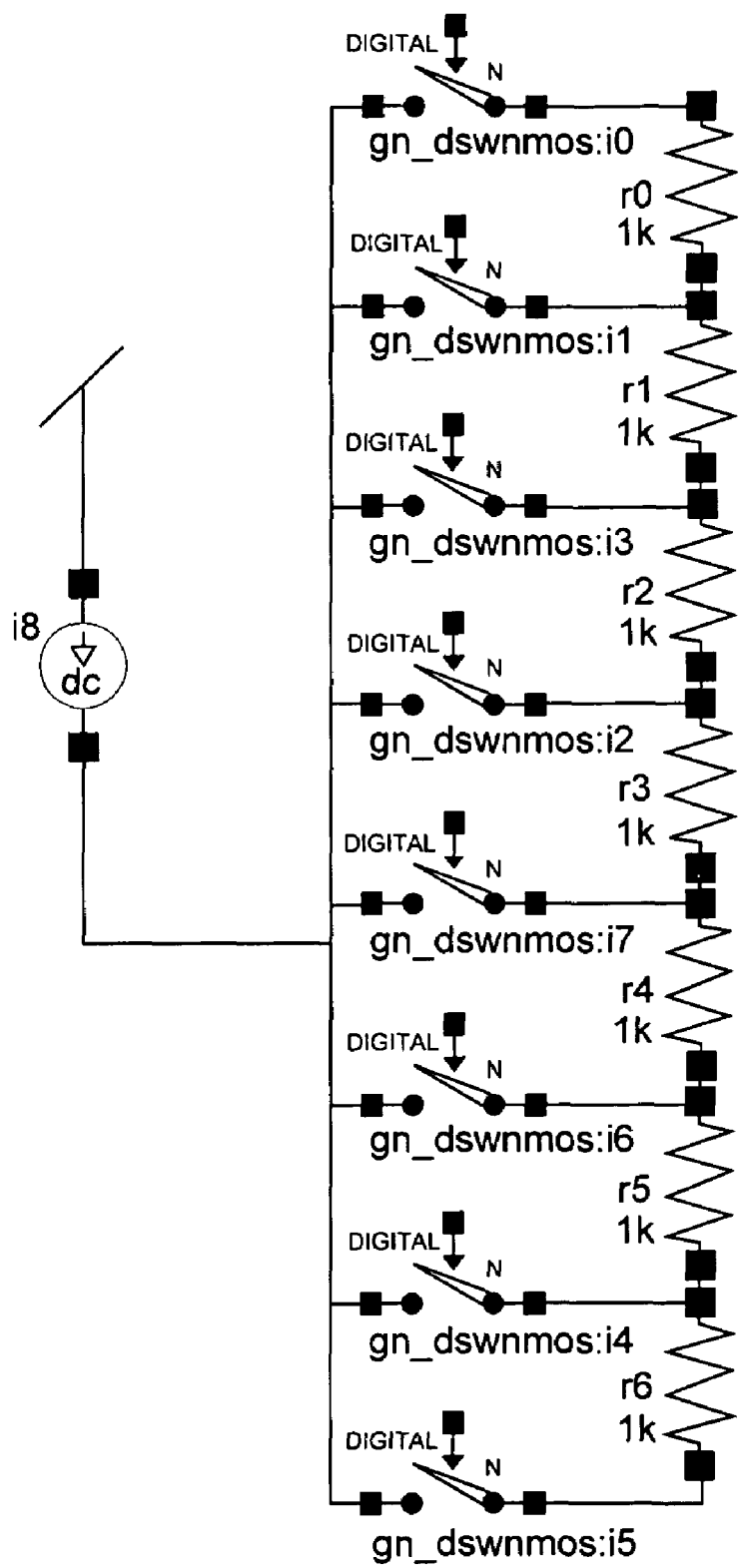
FIG. 3 illustrates an exemplary resistor string with $2^n$ resistors which will be connected in a cyclic fashion, and termed ONE-HOT decoding scheme.
Figure 4:
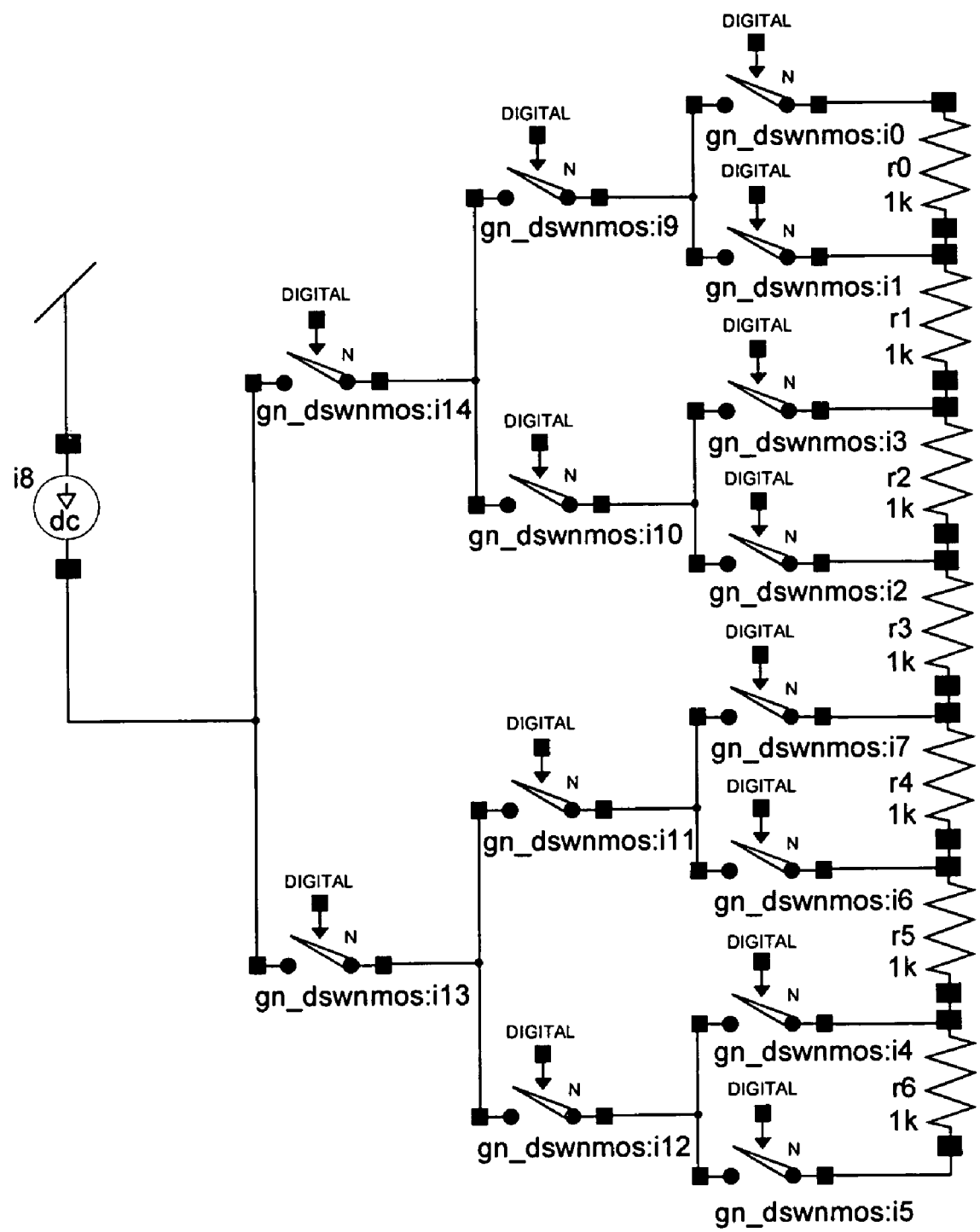
FIG. 4 illustrates an exemplary arrangement of the coupling switches used in connecting the current sources and the output; and, FIG. 5 illustrates an example of a frequency of appearance vs. output code for a 14 bit DAC using the invention.

Notes on the decoding of coupling switches: The coupling switches as shown in FIG. 4 herein are just one example of how the current sources and the output can be used in this DAC. For instance, consider the following example:

Suppose there are 8 nodes, to which the single current source be connected. The decoding, which will determine the ON state of the switches, will be based on some digital input code. Only one switch will be ON at a given time. Now, there can be multiple configurations to do so. In one embodiment, 8 switches can be connected in parallel. One end of 8 current switches is connected to individual nodes, while the other ends of all switches can be connected to the current source. This kind of decoding is called ONE-HOT decoding (FIG. 3). In another embodiment, the switches can be connected as shown in FIG. 4. This kind of architecture is called binary decoding. In other embodiments, a mix of any decoding scheme can be used. Therefore, it is noted that the switching scheme as shown in FIG. 4 is just by way of an example, and is not unique.

The cyclic resistor string DAC with multiple current sources can be used as a differential DAC, with varying/non-varying common mode. However, it can be implemented with some loss of redundancy present in the architecture. The loss of redundancy is because of the fact that the differential nature of the output signal will impose additional restrictions on the node positions of the current sources and the outputs.

Described hereinabove is a novel mixed-mode DAC Architecture using a single cyclic resistor string and a plurality of current sources. It has been shown that it is possible to achieve 2 (n-1) b resolutions with $2^n$ resistors and 2 current sources. Using the frequency of appearance plot, the above approach exhibits the scope of multi-dimensional optimization. Also, it is noted that it is possible to achieve a higher DNL/INL (differential nonlinearity/integral nonlinearity) than the matching accuracy of the resistors in the resistor string. With this architecture, the performance of the DAC core is primarily dependant on the digital decoding algorithm and the level of optimization of the digital algorithm. Therefore, there has been a transition from "ANALOG" accuracy requirement to "DIGITAL" optimization. This architecture can be extended to 'm' current sources for increasing the resolution and/or dynamic range achieving other performance aspects.

As described hereinabove, $2^n$ unit impedances in the cyclic string result in 2(n-1) bit resolution. Thus, the single resistance cyclic string achieves the function of both MSB sub-string and LSB sub-string. Further minor details and working of the DAC from the point of view of functioning through the resistors, are intelligible to those who are skilled in the art. Some salient features of the present embodiment and significant differences from the prior art are explained below:

1. In the present invention, a single resistor string is arranged in a cyclic configuration and at least two current sources are coupled to certain nodes of the cyclic resistance string. The output is tapped from various points to generate LSB voltages corresponding to the input digital code. It is shown that using 2 current sources and $2^n$ resistors, it is possible to generate 2(n-1) bit resolution.

2. There is a considerable reduction in the switch sizes (use of smallest switch size is possible), which is a major limitation for most directly coupled, segmented string architecture, thus saving in silicon area.

3. In the present invention, there is a lot of redundancy in the architecture. Therefore, there is a possibility of using dynamic element matching and other cyclic techniques to achieve higher resolution, which is normally limited by the matching accuracy of the impedance elements.

4. There is no requirement for amplifiers coupling the LSB string to the MSB string, thus eliminating any linearity errors therefrom.

5. There is scope for optimization of a digital decoding algorithm for selecting and coupling nodes with output and current sources respectively.
6. The novelty of the use of single cyclic resistor string in its present form is demonstrated, which is not available in any other prior art.
7. As the architecture is inherently current driven, the dynamic performance of the architecture is better than that of the normal segmented string architecture.
8. The illustrated arrangement is more area efficient than the prior art for the same level of performance. Also, redundancy (not present in the prior art) is an additional benefit from the architecture for a given area from the digital decoding logic.

Figure 5:
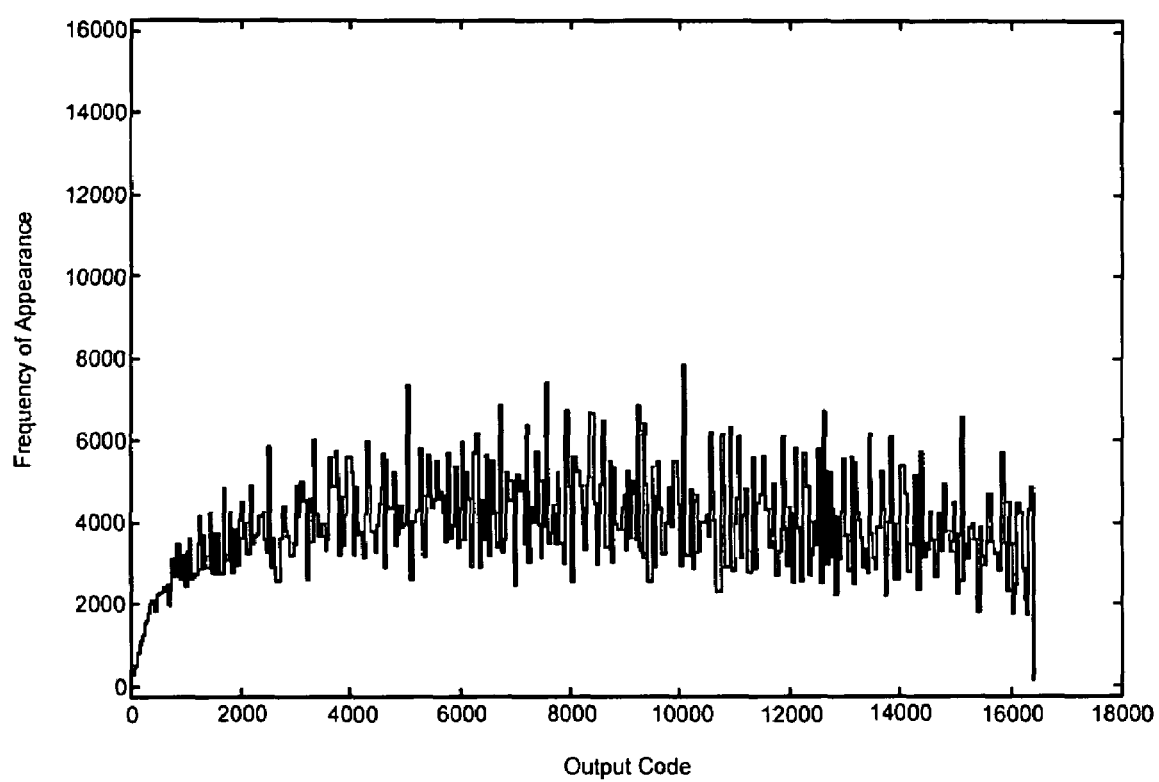

FIG. 5 illustrates an example of a frequency of appearance vs. output code for a 14 bit DAC using the invention, and is self explanatory. The present architecture was implemented in MATLAB and some results for n=8 (14 bit DAC) are presented. This architecture is ideally suited for higher resolution DACs. In FIG. 5, the frequency of appearance of each output code is plotted across all values of x, y and z vs. the output code. It is noted that the frequency of appearance is defined as the count of appearance of each output code for various combinations of x, y and z. The minimum value of frequency of appearance=4, maximum being 65790 and mean being 793.4. From this, it is concluded that there are an average of 793 combinations of x, y and z to produce the same output code across the entire cyclic string.

Figure 6:
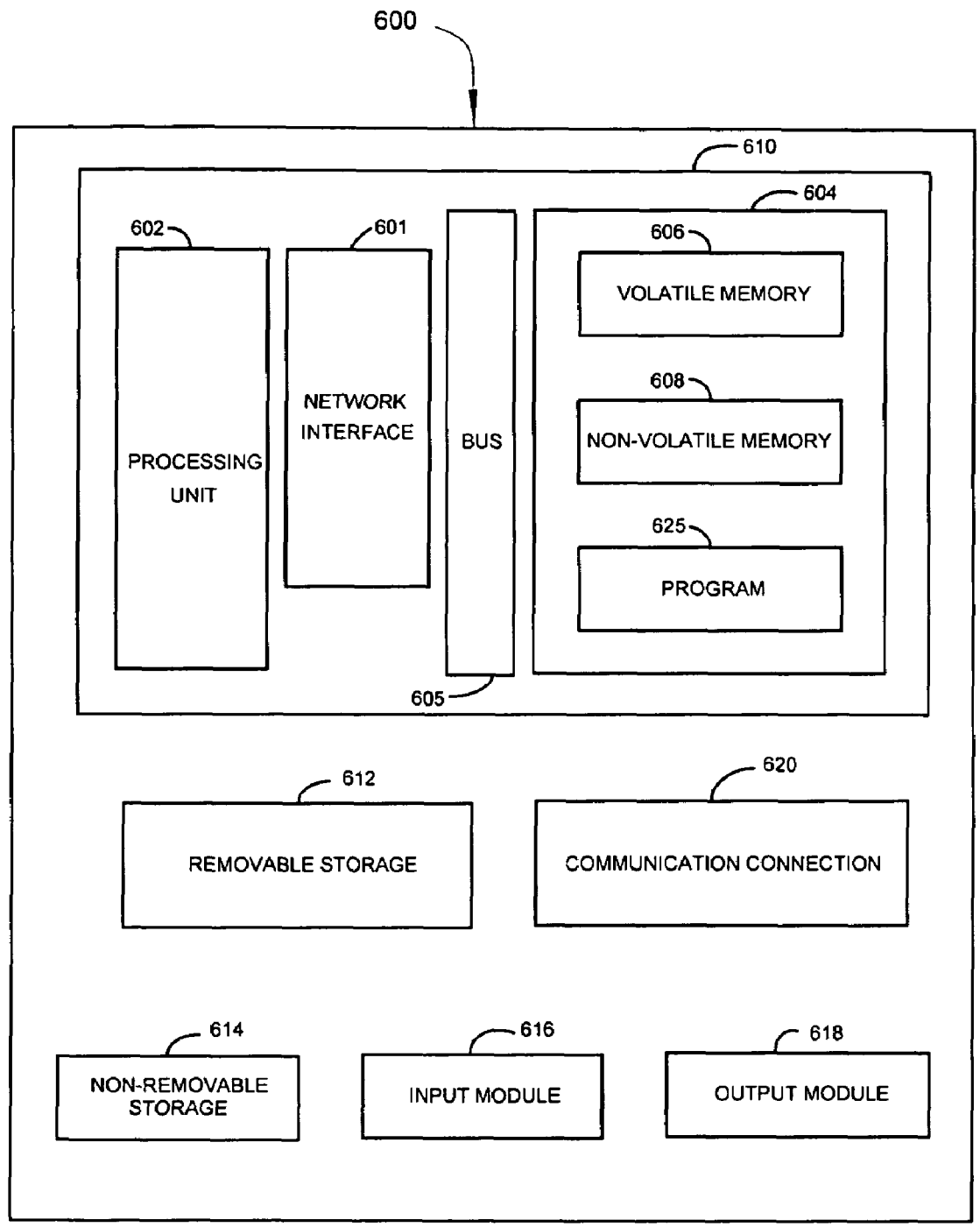
FIG. 6 illustrates an exemplary general purpose computing platform which can be used in the practice of the invention.

A general purpose computing platform may be deployed to implement the method described hereinabove. FIG. 6 shows an example of a suitable computing system environment for implementing embodiments of the present subject matter. FIG. 6 and the following discussion are intended to provide a brief, general description of a suitable computing environment in which certain embodiments of the inventive concepts contained herein may be implemented.

With reference to FIG. 6, a general purpose computing platform 600 may comprise a computing device in the form of a computer 610 which may include a processing unit 602, memory 604, removable storage 612, and non-removable storage 614. Computer 610 additionally includes a bus 605 and a network interface 601. Computer 610 may include or have access to a computing environment that includes one or more user input modules/devices 616, one or more output modules or devices 618, and one or more communication connections 620 such as a network interface card or a USB connection. One or more user input devices 616 can be a touch screen and a stylus or the like. The one or more output devices 618 can be a display device of computer, computer monitor, TV screen, plasma display, LCD display, display on a touch screen, display on an electronic tablet, or the like. The computer 610 may operate in a networked environment using the communication connection 620 to connect to one or more remote computers. A remote computer may include a personal computer, server, router, network PC, a peer device or other network node, and/or the like. The communication connection may include a Local Area Network (LAN), a Wide Area Network (WAN), and/or other networks.

With further reference to FIG. 6, the memory 604 may include volatile memory 606 and non-volatile memory 608. A variety of computer-readable media may be stored in and accessed from the memory elements of computer 610, such as the volatile memory 606 and the non-volatile memory 608, removable storage 612 and non-removable storage 614. Computer memory elements can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks™, and the like, chemical storage, biological storage, and other types of data storage.

"Processor" or "processing unit" as used herein, means any type of computational circuit, such as, but not limited to a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor, or any other type of processor or processing circuit. The term also includes embedded controllers, such as generic or programmable logic devices or arrays, application specific integrated circuits, single-chip computers, smart cards, and the like.

Embodiments of the present subject matter may be implemented in conjunction with program modules, including functions, procedures, data structures, application programs, etc., for performing tasks, or defining abstract data types or low-level hardware contexts.

Machine-readable instructions stored on any of the above-mentioned storage media are executable by the processing unit 602 of the computer 610. For example, a computer program 625 may include machine-readable instructions capable of providing area-efficient DACs with a single cyclic impedance string which is coupled to a negative reference and having multiple current sources according to the teachings of the described embodiments of the present subject matter. In one embodiment, the computer program 625 may be included on a CD-ROM and loaded from the CD-ROM to a hard drive in non-volatile memory 608. The machine-readable instructions cause the computer 610 to decode according to the various embodiments of the present subject matter.

The above-described technique provides various embodiments for providing area-efficient DACs with a single cyclic impedance string which is coupled to a negative reference and having multiple current sources. A variation of the technique uses a digital switching algorithm for driving the DAC and for selecting an output node for delivering a desired output voltage. It is to be understood that the above-description is intended to be illustrative, and not restrictive. Many other embodiments will be apparent to those of skill in the art upon reviewing the above-description. The scope of the subject matter of the present invention should therefore be determined with reference to the following claims, along with the full scope of equivalents to which such claims are entitled.

The invention claimed is:

1. A DAC (Digital to Analog Converter) architecture comprising:
 a single resistance string arranged to have a cyclic configuration and a plurality of nodes, one of the nodes being connected to a known potential;
 at least two current sources connected to selected ones of said nodes through operable switches; and,
 an output connected to a selected one of said nodes, wherein the DAC architecture is valid for any resolution, and wherein the DAC is chosen from single ended DAC and a differential DAC with varying/non-varying common mode.

2. The DAC architecture as in claim 1, comprising $2^n$ cyclic string resistors and two current sources, configured to generate $2^{2n-2}$ LSB (least significant bit) voltage levels from said $2^n$ cyclic string resistors and two current sources, where n=number of LSB bits.

3. The DAC architecture as in claim 1, including the relationship:

$$I_{msb} = \frac{V_{msb}}{R} = \frac{2^n V_{lsb}}{R}$$

where, n=Number of LSB bits
$V_{lsb}$=Unit LSB Step Size (in volts)
$V_{msb}$=Unit MSB Step Size (in volts)
R=Unit Resistor (in ohms)
$I_{msb}$=Unit MSB Current source (in amps).

4. The DAC architecture as in claim 1 wherein, there are $2^n$ cyclic string resistors, and there are $2^{3n}$ multi-transitional nodal points defining only $2^{2n-1}$ LSB points on the single cyclic string of resistors where n=number of LSB bits.

5. The DAC architecture as in claim 1 comprising (2n−2) bits, $2^n$ resistors and two current sources, configured to achieve spurious-free resolution of (2n−2) bits and (2n−1) bit resolution with lower SNDR by using said $2^n$ resistors and two current sources where n=number of LSB bits.

6. An integrated circuit including a DAC architecture driven by a digital algorithm and comprising:
  a single resistance string arranged to have a cyclic configuration and a plurality of nodes, one of the nodes being connected to a known potential;
  at least two current sources connected to selected ones of said nodes through operable switches; and,
  an output delivering a voltage, said output being connected to a pre-selected node with selective guidance from said digital algorithm, wherein the DAC architecture is valid for any resolution and wherein the DAC is a single ended DAC or a differential DAC with varying/non-varying common mode.

7. The integrated circuit with DAC architecture as in claim 6, comprising $2^n$ cyclic resistors and two current sources, configured to generate $2^{2n-2}$ LSB (least significant bit) voltage levels from said $2^n$ cyclic string resistors and two current sources where n=number of LSB bits.

8. The integrated circuit with DAC architecture as in claim 6, including the relationship $$I_{msb} = \frac{V_{msb}}{R} = \frac{2^n V_{lsb}}{R}$$

where
n=Number of LSB bits.
$V_{lsb}$=Unit LSB Step Size (in volts)
$V_{msb}$=Unit MSB Step Size (in volts)
R=Unit Resistor (in ohms)
$I_{msb}$=Unit MSB Current source (in amps).

9. The integrated circuit with DAC architecture as in claim 6 wherein, there are $2^n$ cyclic string resistors, and there are $2^{3n}$ multi-transitional nodal points defining only $2^{2n-1}$ LSB points on the single cyclic string of resistors where n=number of LSB bits.

10. The integrated circuit with DAC architecture as in claim 6, comprising $2^n$ resistors and two current sources configured to achieve spurious-free resolution of (2n−2) bits and (2n−1) bit resolution with lower SNDR by using said $2^n$ resistors and two current sources where n=number of LSB bits.

11. A method of designing DAC architecture, comprising:
  providing a single cyclic resistor string having a cyclic configuration and a plurality of nodes, and connecting the nodes to a known potential;
  using a plurality of current sources and connecting the current sources to selected nodes x and y through a first set of operable first and second switches; and,
  using a digital switching algorithm for driving the DAC and for selecting an output node z to which an output line is connected for delivering a desired output voltage, including the step of using more than two current sources to increase a level of redundancy resolution and differential output with varying common mode of the DAC architecture, and for achieving dynamic element matching and switched capacitor application.

12. The method as in claim 11, including the step of adding a level of redundancy through a second set of operational coupling switches.

13. The method as in claim 11, including the step of using a plurality of current sources of appropriate value, and using $2^n$ resistors to construct a 2n−2 bit cyclic DAC where n=number of LSB bits.

14. The method as in claim 11, including using n switches at each node for coupling n current sources, including using one switch per node for selectively coupling equal-voltage nodes.

15. The method as in claim 11, including the step of using granularity of randomness and cyclic redundancy to generate required voltages at 2n−2 bit level, where there are $2^n$ resistors in the cyclic resistor string where n=number of LSB bits.

16. A computer readable medium encoded with data in executable form, which when executed by a computing platform will result in execution of a method of designing DAC architecture, as in claim 11.

* * * * *